United States Patent [19]

Katz

[11] Patent Number: 4,882,547

[45] Date of Patent: Nov. 21, 1989

[54] LINEARIZER CONTROL SYSTEM

[75] Inventor: Allen Katz, West Windsor Township, Mercer County, N.J.

[73] Assignee: General Electric Company, East Windsor, N.J.

[21] Appl. No.: 271,469

[22] Filed: Nov. 15, 1988

[51] Int. Cl.$^4$ .............................................. H03F 1/32
[52] U.S. Cl. ..................................... 330/149; 328/162
[58] Field of Search ........................ 330/149; 328/162; 375/60; 332/37 R, 37 D; 455/50, 63

[56] References Cited

U.S. PATENT DOCUMENTS

| | | | |
|---|---|---|---|
| 3,185,887 | 5/1965 | Kobbe | 315/26 |
| 3,434,056 | 3/1969 | Becker | 328/162 X |
| 3,889,229 | 6/1975 | Kostelnicek et al. | 330/149 X |
| 4,039,965 | 8/1977 | Ishii | 330/149 X |
| 4,238,855 | 12/1980 | Zborowski | 455/103 |
| 4,317,083 | 2/1982 | Boyd | 330/296 |
| 4,329,655 | 5/1982 | Nojima et al. | 330/149 |
| 4,531,098 | 7/1985 | Reed | 330/53 |
| 4,536,846 | 8/1985 | Raychaudhuri et al. | 364/514 |
| 4,560,945 | 12/1985 | Olner | 330/149 |
| 4,588,958 | 5/1986 | Katz et al. | 330/149 |
| 4,604,589 | 8/1986 | McGann | 332/37 R |
| 4,639,938 | 1/1987 | Kennett | 375/60 |
| 4,669,091 | 5/1987 | Nossen | 375/14 |
| 4,675,618 | 6/1987 | Cross | 332/18 |
| 4,701,717 | 10/1987 | Radermacher et al. | 330/149 |
| 4,736,391 | 4/1988 | Siegel | 375/76 |
| 4,737,733 | 4/1988 | LaPrade | 330/277 |
| 4,772,855 | 9/1988 | Buoli et al. | 330/149 |

Primary Examiner—James B. Mullins
Attorney, Agent, or Firm—William H. Meise

[57] ABSTRACT

An active or translating device having distortion is associated with a controllable predistortion circuit or linearizer. A filter sampler arrangement samples the desired fundamental-frequency signal and its second harmonic. A control circuit forms the ratio of the amplitude of the second harmonic divided by the amplitude of the fundamental-frequency signal, and controls the linearizer to minimize the ratio.

18 Claims, 5 Drawing Sheets

LINEARIZER CONTROL SYSTEM

BACKGROUND OF THE INVENTION

This invention relates to control circuits for linearizers or predistortion circuits.

Communication systems have become extremely important in modern society. Almost all communication systems require some form of electrical or electronic signal amplifiers to overcome system losses. Many communication circuits involve very large capital expenditures, as for example, ordinary coaxial land lines or transoceanic cable systems and satellite-relayed communications, which in addition to the expensive satellite require costly Earth stations. Because of the large capital expenditures involved in installing such systems, it is economically very desirable to multiplex the signals passing through the communications channel or channels. Multiplexing means passing many signals through the same signal path. There are many methods for maintaining the signals passing through the channel as separate signals, among which methods are frequency division multiplex and code-division multiplex.

Ordinarily, a communications channel includes active devices which modulate the signal, demodulate the signal, amplify, and otherwise translate (process) the signals. Many such active devices, notwithstanding the best efforts of the designers to make them perfect, have residual nonlinearities in their signal transfer functions. It is well known that such nonlinearities contribute to various forms of signal distortion, especially when more than one signal is present in the transmission path. These distortions include harmonic distortion and, in the case of multiple signals traversing the signal path, intermodulation distortion. These distortions may tend to make a voice unintelligible in a telephone context, or may introduce various distortions and interferences in the context of a television signal, and in the context of data communications may increase the bit error rate.

The nonlinearities which occur in active devices tend to be most severe in devices which must handle substantial power, such as the final amplifier stage in a transmitter, whereas low-level stages may contribute negligible amounts of nonlinearity by comparison with a final output stage. Consequently, an art has grown up which precedes the final amplifier or amplifiers (or other distortion-producing active stages) with a predistortion network which introduces a distortion which is opposite to the distortion introduced by the amplifier or stage being compensated. The predistortion circuit is sometimes known as a linearizer. The use of such a predetermined distortion circuit in conjunction with a traveling wave tube (TWT) amplifier is described in U.S. Pat. No. 4,701,717 issued Oct. 20, 1987 in the name of Radermacher et al. An adjustable or presettable reflective predistortion circuit used in conjunction with an amplifier for microwave applications is described in U.S. Pat. No. 4,588,958 issued May 13, 1986 in the name of Katz et al.

The active circuits with which linearizers are used may change their linearity as a function of time, especially in the case of vacuum-tube type equipment. Even though solid-state equipment is nominally unaffected by aging, paralleled amplifier arrangements such as that described in U.S. Pat. No. 4,641,106 issued Feb. 3, 1987 to Belohoubek et al. may suffer a change in performance if one or more of the plural paralleled amplifiers should fail. Other causes of change in solid-state active devices might occur due to electrostatic discharge or ionizing radiation, or to change in supply voltage or the like. Such changes ordinarily result in a change in distortion characteristics even if the signal being handled remains at the same level.

Nonlinearity-induced distortion produced in a signal which traverses an active device may also change if the number of such signals traversing the active device changes, or if their amplitude changes. Controllable predistortion circuits are more desirable than fixed predistortion circuits because they can be adjusted from time to time to minimize the overall nonlinearity and thereby reduce the distortion of the desired processed signals. For example, the adjustable predistortion circuit described in the aforementioned Katz et al. patent, if used on a satellite, could have its control input terminals connected to remotely controllable power supplies. Plural test signals could be transmitted from an Earth station over the satellite channel, and the nonlinearity introduced by the active stages could be measured in terms of two-tone intermodulation. The predistortion circuit could then be adjusted by remote variation of the remotely controllable power supplies to minimize the intermodulation. Such an alignment arrangement is disadvantageous because it requires transmission of additional signals through the channel which may already be near its maximum signal-handling capability. It is even more disadvantageous if normal operation signals must be taken off-line in order to apply the test signals in order to perform the test and make the predistortion adjustment.

Another method for performing the same adjustment could be to use the normal operation "desired" signals as test signals, and to measure, by the use of a spectrum analyzer the level of intermodulation introduced by the active stage. However, the display of a spectrum analyzer is hard to read and it may be read inaccurately, especially if the overall level of low-level distortions is to be measured in the presence of many relatively high-level desired signals. Specialized circuitry similar to a spectrum analyzer with an additional integrator for summing the amplitudes of signals lying within a particular amplitude range might be devised for indicating the distortion performance when many normal operation signals are used for test, but this would be expensive, would require specially trained operators, and would only correct at the time that the adjustment was made, leaving open the possibility of a change in performance at any time after the adjustment.

A simple test and control arrangement is desirable for setting predistortion circuits for linearizers.

SUMMARY OF THE INVENTION

An arrangement for controllably distorting a signal for correction of distortion introduced by an active stage uses an active stage including input and output ports for processing signals applied to the input port for producing processed signals at the output port, the processing being accompanied by distortion. A controllable predistorter or linearizer is coupled to at least one port of the active stage for distorting signals applied thereto. The distorting of the signals produced by the linearizer is opposite to and either equal in magnitude, greater than, or less than the magnitude of the distortion introduced by the active stage. First and second filters are coupled at least to the output port of the active stage. The first filter is tunable at least to pass the frequency of a signal which the active stage is adapted to receive at the input port, and to reject a particular harmonic thereof. A second filter is coupled to at least the output port of the active stage and is tuned to pass at least that particular harmonic of the signal which the active stage is adapted to receive at its input port. A signal processor is coupled to the first and second filters for forming a processed signal representative of the ratio of the filtered signals. A control arrangement is coupled to the signal processor and to the controllable linearizer for adjusting the controllable linearizer in a manner which tends to minimize the ratio for thereby tending to make the amplitude of the predistortion equal to the amplitude of the distortion for cancellation.

DESCRIPTION OF THE INVENTION

Figure 1:
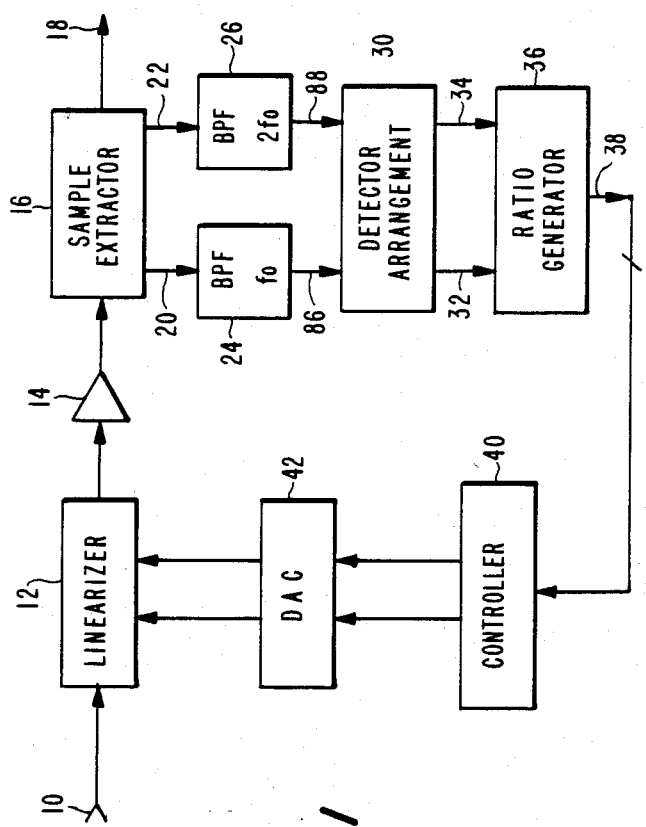
FIG. 1 is a simplified block diagram of an arrangement according to the invention.

In FIG. 1, signal to be amplified is applied from a source (not illustrated) by way of an input port 10 to the input of a linearizer or predistortion circuit illustrated as a block 12. Linearizer 12 is conventional, and may be similar to that described in the aforementioned Katz et al. patent. The predistorted signal is applied from the output of linearizer 12 to the input port of an amplifier 14 which amplifies the signal and which incidentally introduces a distortion which is to be at least partially cancelled by the oppositely-poled distortion of linearizer 12. The amplified signal is applied from the output of amplifier 14 by way of a sample extractor 16 to an output port 18, where it becomes available for use by a utilization device such as an antenna (not illustrated). Sample extractor 16 extracts two samples of the signal flowing from amplifier 14 to output port 18, and applies the samples by way of conductors 20 and 22 to a first bandpass filter 24 centered at a first frequency $f_0$ and to a second bandpass filter 26 center at a frequency of $2f_0$, respectively. In the context of a communications satellite, bandpass filter 24 may have a bandpass centered at 4 GHz with a 500 MHz bandwidth, corresponding to frequencies of signals in the "C" band. In accordance with the invention, bandpass filter 26 may have a center frequency of 8 GHz with a 1 GHz bandwidth. Thus, bandpass filter 24 has a bandpass selected to pass all of the "desired" signals, together with any intermodulation distortion falling within the same frequency range, while filter 26 has a bandpass selected to pass the second harmonic (i.e. twice the frequency) of the signals which are passed by filter 24.

The signals from filters 24 and 26 are applied by way of transmission lines illustrated as conductors 86 and 88, respectively, to a detector arrangement illustrated as a block 30. Detector arrangement 30 detects the signals from filters 24 and 26 separately and applies the resulting detected signals separately over conductors 32 and 34, respectively, to a ratio generator illustrated as a block 36. Ratio generator 36 produces a digital signal on a conductor set 38 which represents the ratio of the magnitude of the signal applied to ratio generator 36 by way of conductor 34 divided by the magnitude of the signal applied over conductor 32. In effect, this ratio-representative signal represents the combined second harmonic content of the desired signals normalized to the magnitude of the desired signals. The ratio-representative signal is applied over conductor set 38 to a controller illustrated as 40 which may include a microprocessor. Controller 40 is preloaded with information relating to the characteristics of linearizer 12 as a function of its control voltage or voltages. Controller 40 adjusts the control voltages by applying digital words to a digital-to-analog converter (DAC) or, if multiple analog control voltages are required, to an array of DACs illustrated together as a block 42, which generates one or more analog voltages for application to linearizer 12 for control thereof.

Figure 2A:
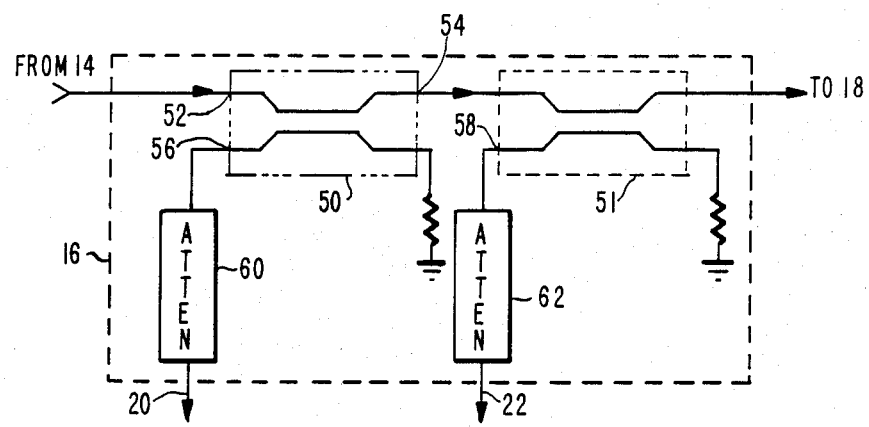
FIGS. 2a and 2b are simplified schematic representations of a sample extractor which may be used in the arrangement of FIG. 1.

FIG. 2a illustrates in simplified schematic form details of a sample extractor which may be used for sample extractor 16 of FIG. 1. In the FIGURES, elements corresponding to those of other FIGURES are designated by the same reference numerals. In FIG. 2a, signals from amplifier 14 are applied to an input port 42 of a 10 dB, 90° directional coupler 50. As known, substantially all of the energy applied to input port 52 of directional coupler 50 exits from an exit port 54 and is available for application to output port 18 by way of a second directional coupler 51 identical with coupler 50. Signal samples which are 10 dB down with respect to the signal applied to input port 52 appear at output port 56 of coupler 50 and output port 58 of directional coupler 51. These two signal samples may differ slightly in amplitude, but this has no significant effect on the following stages, and the signals may be considered to be of equal amplitudes. The signals exiting from ports 56 and 58 are applied by way of impedance-improving attenuators 60 and 62, respectively, to transmission lines represented by conductors 20 and 22, respectively.

Figure 2B:
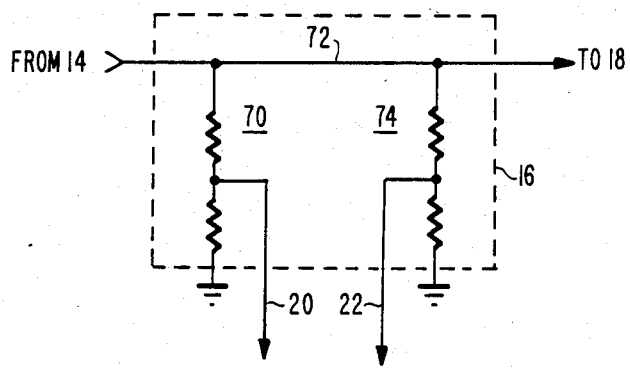

FIG. 2b illustrates an alternative embodiment of sample extractor 16. In FIG. 2b, conductor 20 is connected to a resistive voltage divider designated generally as 70 which is connected between ground and a through path illustrated as a conductor 72. Similarly, output conductor 22 is connected to the tap of a further voltage divider designated generally as 74 paralleled with divider 70. Such paralleled voltage dividers tend to reduce the impedance of the transmission line represented by through conductor 72, and this may be compensator for, if desired, by series resistors (not illustrated).

Figure 3A:
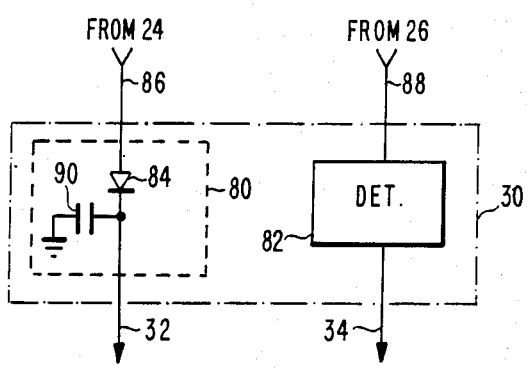
FIGS. 3a and 3b are simplified block diagrams of arrangements which may be used in the detector of FIG. 1.

FIG. 3a illustrates in simplified block and schematic form an embodiment of detector arrangement 30 which may be used in the arrangement of FIG. 1. In FIG. 3a, signal arriving from bandpass filter 24 is applied by way of conductor 86 to a first detector 80, and signal from bandpass filter 26 is applied by way of conductor 88 to a second detector 82. Detector 82 is identical to detector 80, so only detector 80 is discussed in detail. In FIG. 3a, detector 80 is illustrated as a diode detector which includes a series semiconductor diode 84 having its anode connected to the transmission line represented by conductor 86. The cathode of diode 84 is connected to one electrode of a capacitor 90, the other electrode of which is grounded. Detected signal is generated across capacitor 90 and is made available on output conductor 32.

As mentioned in conjunction with the discussion of FIG. 1, the signal applied to controller 40 represents the ratio of the magnitudes of the desired signals to their harmonics. In general, the desired fundamental frequency ($f_0$) signals will be much greater in amplitude than their second harmonics ($2f_0$). Consequently, detectors 80 and 82 of FIG. 3a will operate on different portions of their diode curves and will have different efficiencies. As the linearizer is adjusted, the efficiencies may change and thereby introduce a measure of inaccuracy in the control. Also, even at the same signal level, the semiconductor diodes will produce different output signals, which will also introduce inaccuracy in the perceived ratio and in the resulting control.

Figure 3B:
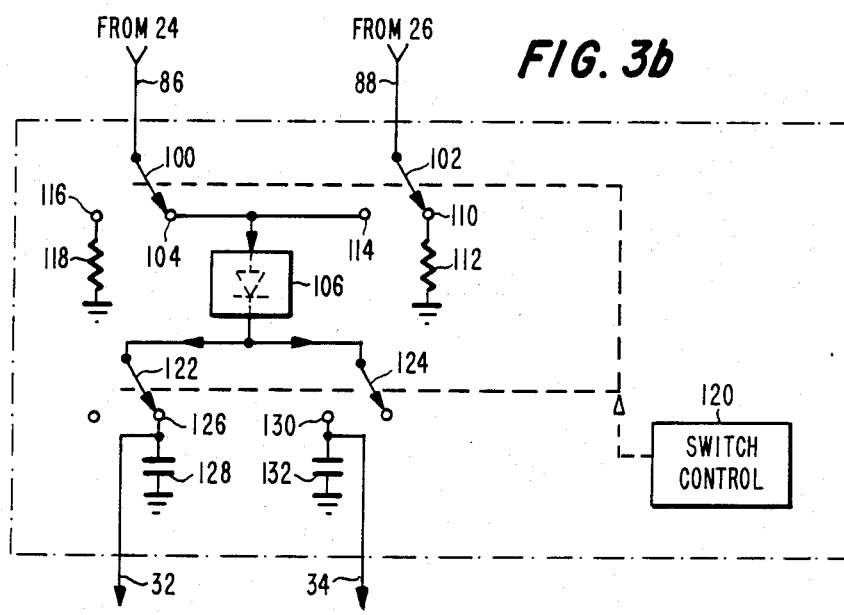

The arrangement of FIG. 3b is an alternative to that of FIG. 3a, and uses switches to multiplex the filtered signals to and from a single detector diode. In FIG. 3b, the band-filtered signals from filters 24 and 26 are applied over conductors 86 and 88, respectively, to the common poles of ganged single pole, double throw switches illustrated as mechanical switches 100 and 102, respectively. Those skilled in the art know that solid-state switch equivalents are desirable for reliability and for operating speed, but mechanical switches are illustrated for ease of understanding. In the illustrated positions of switches 100 and 102, the signals applied over conductor 86 are coupled by way of a terminal 104 to a detector diode illustrated as 106. Also in the illustrated positions of switches 100 and 102, the signals from conductor 88 are applied by way of a switch terminal 110 to a load resistor 112 which may be matched to the system impedance, which may be, for example, 50 or 75 ohms, to prevent reflections. In the alternate positions (not illustrated) of switches 100 and 102, signals from conductor 88 are applied by way of a switch terminal 114 to detector diode 106, and signals from conductor 86 are applied by way of a switch terminal 116 to a load resistor 118. The signals from bandpass filters 24 and 26 are thus applied alternately to detector diode 106 at a rate established by a switch control circuit illustrated as a block 120. Switch 120 operates at a rate which is low enough so that many cycles of signal carrier are applied to diode 106 in each position of the switches, but high enough so that the integrated signal does not include switch-rate components. A suitable switch rate might be 1000 Hz. Detector diode 106 detects or rectifies the applied signal received from switches 100 and 102 and applies the detected signal to the common terminals of further single pole, double throw switches 122 and 124, which are ganged with switches 100 and 102. In the illustrated positions of switches 122 and 124, the detected signals are applied by way of a switch terminal 126 to an integrating capacitor 128. In the alternate position of switches 122 and 124 (not illustrated), the detected signal from diode 106 is applied by way of a switch terminal 130 to a second integrating capacitor 132. The detected signal from bandpass filter 24 is thus detected by detector diode 106 and integrated by integrating capacitor 128, and the signal from bandpass filter 26 is also detected by detector diode 106 but is integrated by capacitor 132. The detected signals, therefore, appear across capacitors 128 and 132 and are coupled onto conductors 32 and 34, respectively. The arrangement of FIG. 3b by use of a single detector diode 106 eliminates the differences attributable to different detector diodes.

Figure 4A:
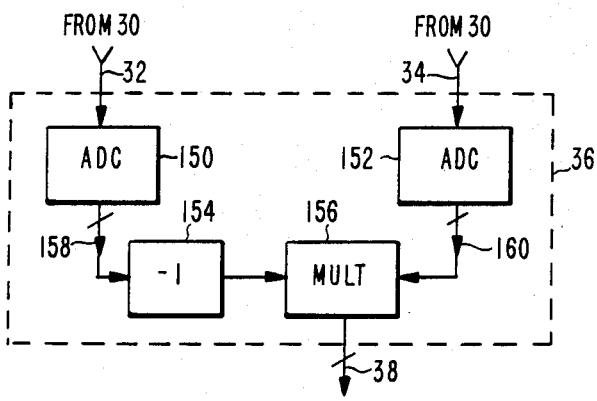
FIGS. 4a, 4b, and 4c are simplified block diagrams of ratio generators which may be used in the arrangement of FIG. 1.

FIG. 4a illustrates a ratio generator which may be used for ratio generator 36 of FIG. 1. In FIG. 4a, detected signal from detector arrangement 30 which is representative of the amplitude of the "desired" or "fundamental" signal is applied over conductor 32 to the input of an analog-to-digital converter (ADC) illustrated as a block 150, which produces digital words on a conductor set 158. Similarly, the harmonic-representative detected analog signal from detector 30 is applied over conductor 34 to a second ADC 152, which converts to digital form and produces words on conductor set 160. Digital multipliers are easier to make than digital dividers. Consequently, two multipliers may be used instead of a single divider in order to divide the digital signal produced by ADC 152 by the digital signal produced by ADC 150. The first multiplier, illustrated as 154, multiplies the signal produced by ADC 150 by $-1$ to effectively invert the signal. A second multiplier 156 multiplies the inverted signal from inverter 154 by the signal from ADC 152 to produce a ratio signal on conductor set 38.

Figure 4B:
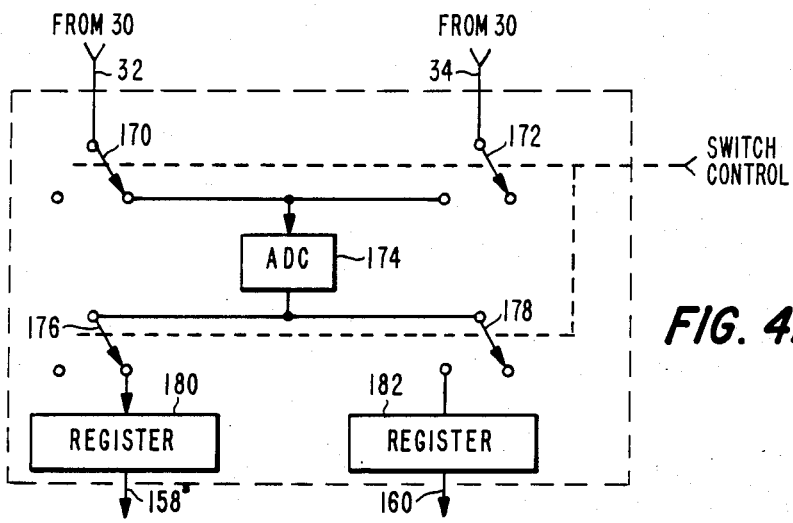

The arrangement of FIG. 4a uses two ADCs. These ADCs are expensive, and furthermore the use of two ADCs can introduce nonlinearities or differences as between themselves which affects the resulting ratio. FIG. 4b illustrates an arrangement using a single ADC together with multiplexing. In FIG. 4b, signal applied from detector arrangement 30 over conductor 32 is coupled to the common element of a single pole, single throw switch 170, and the signal from conductor 34 is applied to the common element of a further single pole, single throw switch 172 which is ganged with switch 170. Switches 170 and 172 are controlled by a switch control circuit similar to that described in conjunction with FIG. 3b, and, in fact, may be controlled by the same switch control of FIG. 3b if that arrangement is used in conjunction with the arrangement of FIG. 4b. Switches 170 and 172 operate alternately to apply the detected signals to the input of a common ADC 174. The output of ADC 174 is applied to the common terminals of two further single pole, single throw switches 176 and 178, which are ganged with switches 170 and 172. In the illustrated positions of switches 170, 172, 176, and 178, signal from conductor 32 is converted to digital form by common ADC 174, and the output words are applied by way of switch 176 to an output register 180 for storage therein by overwriting the previously stored word. The contents of register 180 is made available on output conductor 158 for application (see FIG. 4a) to processing block 154. In the alternate position (not illustrated) of switches 170, 172, 176 and 178 of FIG. 4b, signal from conductor 34 is converted to digital form by common ADC 174 and the digital words so generated are applied by way of switch 178 to a register 182 for storage therein. The word currently stored in register 182 is made available on conductor 160 for application to multiplier 156 (FIG. 4a). The clock rate of ADC 174, registers 180 and 182 may conveniently be the switching rate. The arrangement illustrated in FIG. 4b eliminates ratio errors attributable to differences between ADCs 150 and 152 of FIG. 4a.

Figure 4C:
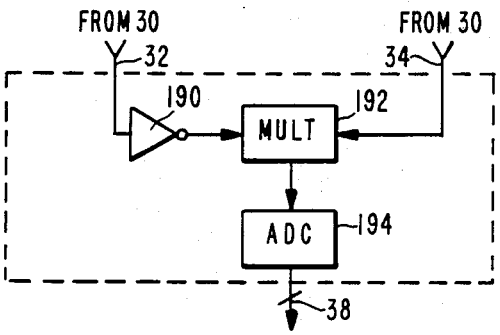

The arrangement of FIG. 4c also uses a single ADC. In FIG. 4c, detected analog signal applied over conductor 32 is applied to an analog inverter illustrated as 190. The inverted analog signal produced by inverter 190 is applied to a first input port of an analog multiplier 192, which receives signal from conductor 34 at a second input port. The analog signal produced by analog multiplier 192 is applied to a single ADC 194 for producing ratio-representative signal on conductor set 38.

However generated, a signal representative of the ratio between the second harmonic and the desired fundamental frequency signal is applied to controller 40.

Figure 5:
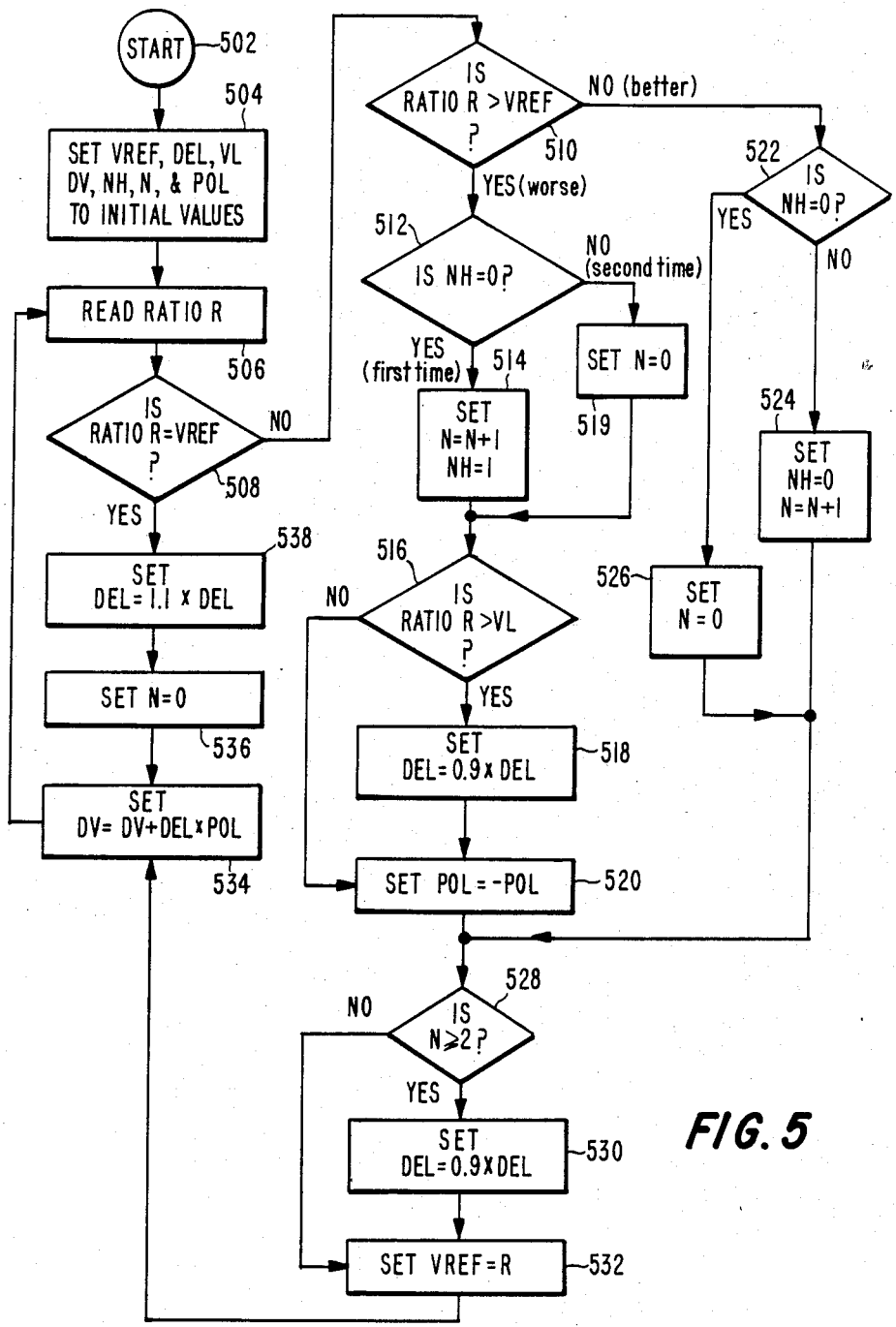
FIG. 5 is a simplified flow chart illustrating a mode of operation of the controller of FIG. 1 to provide control of the linearizer of FIG. 1 to minimize the harmonic ratio.

FIG. 5 is a simplified flow chart illustrating the operation of controller 40 of FIG. 1. It will be assumed that only a diode bias voltage of linearizer 12 of FIG. 1 needs to be adjusted, and that any other bias voltages may be set to constant values. The diode voltage may range from about ½ volt to 1 volt, with the expected value of bias for most corrections near ¾ volt.

At turn-on of controller 40 of FIG. 1, it enters a START mode indicated as 502 in FIG. 5. The logic then flows to a block illustrated as 504, which represents the setting of initial values. The variable VREF represents the last or current value of overall distortion, and is a reference against which the next adjustment is compared to determine whether the distortion is lower (better) or higher (worse), as indicated by high or low values of the ratio R generated on conductor set 38 (FIG. 1) by ratio generator 36. Since at initial turn-on there is no previous value of distortion with which to compare the current value, an intermediate value is initially set. The variable DEL (short for delta) is a variable which controls the magnitude of each increment or decrement of the linearizer diode voltage DV. A limit value VL is set to represent a relatively large, but not the maximum value of ratio R. The state indicator POL (polarity) is arbitrarily set to either +1 to −1, and represents increasing or decreasing direction of control of the diode voltage DV. Running variable N and polarity controlling state variable NH are set to zero.

Once the initial values are set in block 504, the logic flows to a block 506, which represents a reading by controller 40 of the ratio R from conductor set 38. Since signals are traversing linearizer 12 and amplifier 14, some amount of distortion will result, and a ratio R will be generated. The ratio is compared with the initialized value of reference value VREF in a comparison block 508. At initial turn-on, it is very unlikely that the measured harmonic-to-fundamental ratio will exactly equal VREF, the reference value. Consequently, the logic exits comparison block 508 by the NO path, and flows to a further comparison block 510. Comparison block 510 determines whether or not the currently measured value of R is greater than VREF (i.e., the harmonic content is higher or worse than the initially set reference). If the distortion indicated by ratio R exceeds that represented by reference value VREF, the logic leaves comparison block 510 by way of the YES output, and reaches a further decision block 512. Decision block 512 compares NH with zero; immediately after first turn-on NH is zero, so the logic exits comparison block 512 by the YES path. From the YES output of block 512, the logic flows to a block 514, in which NH is set to logic 1 to indicate that a first pass is being made or completed, and running variable N is incremented from zero to one. The logic then arrives at a decision block 516, in which the current value of ratio R is compared with a high-R representative VL reference. A value of R greater than VL means that the linearizer diode control voltage DV is far from the desired value. If it is not far from the desired value, the diode voltage is near the desired value, and the logic leaves comparison block 516 by way of the YES path, and arrives at a block 518 which represents decrementing of the incremental correction DEL to prevent overshooting the optimum adjustment point in an oscillatory manner. If R is greater than VL, it is presumed that a large correction must be made, so the logic leaves comparison block 516 by the NO path, bypassing block 518 and therefore maintaining the step size undiminished. In either case, the logic arrives at block 520, which represents changing the polarity of the correction from positive to negative, or vice versa. The significance of this change becomes apparent on successive passes through the logic.

From block 520 (or from blocks 524 or 526, described below) the logic arrives at a further comparison block 528, where the current value of running variable N is examined to see if it equals or exceeds 2. The value of two represents multiple passes through the logic in one direction of correction. If the current value of N is less than two, additional passes are necessary to verify that the direction of correction is correct, so the logic flows from the NO output of comparison block 528 to a block 532, where the value of VREF is set equal to the current value of ratio R, which will allow comparison at the next step with the current R. On the other hand, if N is two, the same result has occurred on several passes, so the logic leaves comparison block 528 by the YES path and, before arriving at block 532, decrements step size DEL to 90% of its previous value in a block 530. The actual correction of the diode voltage DV is made as represented in a block 534. The diode voltage DV is set equal to the previous value multiplied by DEL and POL. The logic returns to block 506 to begin another pass by reading the new current value of ratio R.

On the second pass, R is compared in comparator 508 with its previous value VREF, and probably flows again to comparison block 510. If the distortion is worse (R is greater than VREF) the direction of correction is wrong, and the logic flows by way of comparison block 512 to block 519, since NH is no longer equal to zero. Running variable N is set to zero in block 519, and, whether or not R is greater than limit value VL, the polarity of correction is again inverted in block 520 without reducing the step size. Reference value VREF is reset to the new higher value of R in block 532. A new correction DV is made in block 534 of magnitude equal to the previous value of DV multiplied by the same-size increment DEL, but of opposite polarity.

Ratio R is again read in block 506, and this time the direction of correction should be correct. However, R≠VREF, so comparison block 508 once again returns the logic to comparison block 510. This time, R should be smaller than VREF, representing a better distortion figure, so the logic will exit block 510 by the NO path, flowing to a comparison block 522, which compares NH with zero. The value of NH was set to one during the first pass, so the logic exits comparison block 522 by the NO path and flows to a block 524, which set NH to zero, and which increments N to N+1. After several passes in which R is less than VREF, N will exceed two, and block 530 will decrement the step size.

The system will continue making smaller and smaller corrections in one direction until R becomes equal to VREF, i.e., until there is no improvement in correction. At that point, the logic flow shifts in comparison block 508 to flow by way of the YES path to a block 538, which increments the step size to the next larger size, and the value of N is reset to zero in block 536. When the diode voltage correction is made in block 534, it is likely that the optimum point will be slightly overshot, resulting in a worse reading of R compared with VREF. This will cause the logic flow on the next pass to take the YES output from comparison block 510, which results in reversal of correction polarity in block 520, but still with a small correction increment DEL.

In its final operating mode, the system makes small increments about the optimum point, reversing correction direction each time the value of distortion ratio R exceeds VREF, its previous value.

Other embodiments of the invention will be apparent to those skilled in the art. For example, the amplitudes of the signals applied to detectors 80 and 82 of FIG. 3a may be substantially equalized by preceding detector 80 by an attenuator dimensioned to equal the difference between the amplitudes of the desired fundamental signals and their harmonics. If the arrangement of FIG. 3a is used with the sampler of FIG. 2a, it is only necessary to make the attenuation of attenuator 60 greater than that of 62 by the amplitude difference. With the detector input signals equalized, the ratio signal will have a different meaning, which may be taken into account in the programming of controller 40. While a 10 dB directional coupler has been described, less loss of the desired high-power signal will be introduced by lesser coupling, as for example −20 dB, in which case detector arrangement 30 of FIG. 1 may be preceded by an amplifier arrangement. While the ratio-representative signal on conductor set 38 has been described as being a digital signal, it could also be in the form of an analog signal. Instead of diode detectors, other types of detectors such as bolometers may be used. Feedforward linearizers may be used instead of predistortion linearizers, and in general any type of controllable linearizer may be adapted for control by harmonic ratio.

What is claimed is:

1. An active device arrangement, comprising:
    active signal translating means including input and output ports, said translating means being adapted to receive signals at said input port for translating said signals applied to said input port for producing translated signals at said output port, the process of translation being accompanied by distortion;
    controllable linearizer means coupled to at least one port of said signal translating means for controllably distorting signals applied thereto;
    first filter means coupled at least to said output port of said signal translating means, said first filter means being tuned to pass the frequencies of said signal which said signal translating means is adapted to receive at said input port and to reject a particular harmonic thereof for producing first filtered signals;
    second filter means coupled at least to said output port of said signal translating means, said second filter means being tuned to pass at least said particular harmonic for thereby producing second filtered signals;
    signal processing means coupled to said first and second filtering means for forming a processed signal representative of the ratio of said first and second filtered signals; and
    control means coupled to said signal processing means and to said controllable linearizer means for adjusting said controllable linearizer means in a manner which tends to minimize said processed signal.

2. An arrangement according to claim 1 wherein said harmonic is a second harmonic.

3. An arrangement according to claim 1 wherein said controllable linearizer means is coupled to said input port of said signal translating means for predistorting signals applied to said input port of said signal translating means.

4. An arrangement according to claim 1, wherein said first filter means is tuned to pass a first predetermined frequency band extending from a first frequency to a higher second frequency, and said second filter means is tuned to pass a second predetermined frequency band extending from a third frequency to a higher fourth frequency, said third frequency being higher than said second frequency.

5. An arrangement according to claim 4 wherein said fourth frequency is substantially twice said second frequency.

6. An arrangement according to claim 5 wherein said third frequency is substantially twice said first frequency.

7. An arrangement according to claim 1 wherein said signal processing means comprises first and second detecting means coupled to said first and second filter means, respectively, for independently detecting said first and second filtered signals to produce first and second detected signals, respectively.

8. An arrangement according to claim 7 wherein each of said first and second detecting means comprises an independent diode detector.

9. An arrangement according to claim 7 wherein said first detecting means comprises a detector and a first integrating means; and
    said second detecting means comprises said detector and a second integrating means.

10. An arrangement according to claim 9 further comprising synchronous switching means coupled to said first and second filter means, to said detector and to said first and second integrating means, for alternately coupling said first and second filtered signals to said detector for alternately producing first and second rectified signals, respectively, and for coupling said first and second rectified signals alternately to said first and second integrating means, respectively.

11. An arrangement according to claim 7 wherein said signal processing means comprises first and second analog-to-digital conversion means coupled to said first and second detecting means, respectively, for forming first and second digital detected signals, respectively.

12. An arrangement according to claim 11 wherein said first and second analog-to-digital conversion means are independent, and further comprising logic means coupled for receiving said first and second digital detected signals for forming a ratio signal representative of said second digital detected signal divided by said first digital detected signal.

13. An arrangement according to claim 11 wherein said first analog-to-digital conversion means comprises an analog-to-digital converter and a first register, and said second analog-to-digital conversion means comprises said analog-to-digital converter and a second register.

14. An arrangement according to claim 13 further comprising switchable routing means coupled to said first and second detecting means, to said analog-to-digital converter and to said first and second registers, for alternately applying said first and second detected signals to said analog-to-digital converter, and for coupling said first and second digital detected signals from said analog-to-digital converter to said first and second registers, respectively.

15. A method for translating signals, comprising:
applying signals, which signals lie within a first frequency range to be translated, to an active signal translator, said translator tending to introduce distortion, for generating translated signals;
coupling said signals to be translated to controllable linearity correction means;
selecting those of said translated signals lying within a predetermined first frequency band lying in said first frequency range in order to produce first filtered signals;
selecting said translated signals lying within a predetermined second frequency band, to produce second filtered signals, said second frequency band including at least one frequency which is a selected harmonic of a frequency lying in said first frequency band;
generating a ratio signal which represents the ratio of the amplitudes of said second filtered signals and said first filtered signals;
controlling said controllable linearity correction means in response to said ratio signal for tending to minimize said ratio signal.

16. A method according to claim 15 wherein said step of selecting said translated signals comprises selecting the second harmonic.

17. A method according to claim 15 wherein said generating step comprises the further steps of
detection of said first and second filtered signals to produce first and second detected signals, respectively;
integration of said first and second detected signals to produce first and second integrated signals, respectively; and
division of one of said first and second integrated signals by the other.

18. A method according to claim 17 wherein said step of division further comprises the steps of:
converting said first integrated signal from analog to digital form to produce first digital signal;
converting said second integrated signal from analog to digital form to produce second digital signal; and
dividing said second digital signal by said first digital signal to produce said ratio signal.

* * * * *